United States Patent

Nagumo

(10) Patent No.: US 9,362,308 B2
(45) Date of Patent: Jun. 7, 2016

(54) SEMICONDUCTOR DEVICE HAVING FINFET STRUCTURES AND METHOD OF MAKING SAME

(71) Applicant: Renesas Electronics Corporation, Kanagawa (JP)

(72) Inventor: Toshiharu Nagumo, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/204,371

(22) Filed: Mar. 11, 2014

(65) Prior Publication Data

US 2014/0252483 A1    Sep. 11, 2014

Related U.S. Application Data

(60) Provisional application No. 61/776,289, filed on Mar. 11, 2013.

(51) Int. Cl.
   H01L 27/12   (2006.01)
   H01L 29/78   (2006.01)
   H01L 21/84   (2006.01)

(52) U.S. Cl.
   CPC .......... *H01L 27/1211* (2013.01); *H01L 21/845* (2013.01)

(58) Field of Classification Search
   CPC ................... H01L 27/0922; H01L 21/823821; H01L 21/845; H01L 27/1211; H01L 29/785; H01L 21/823807
   See application file for complete search history.

(56) References Cited

U.S. PATENT DOCUMENTS

| | | | | |
|---|---|---|---|---|
| 2005/0218427 A1* | 10/2005 | Joshi et al. | | 257/192 |
| 2006/0228851 A1* | 10/2006 | Sadaka | | H01L 29/1054 438/221 |
| 2007/0059875 A1* | 3/2007 | Mishima | | H01L 21/268 438/199 |
| 2007/0254423 A1* | 11/2007 | Chidambarrao et al. | | 438/197 |
| 2008/0169508 A1* | 7/2008 | Chidambarrao | | H01L 21/84 257/351 |
| 2009/0078982 A1* | 3/2009 | Rachmady et al. | | 257/315 |
| 2011/0108920 A1* | 5/2011 | Basker et al. | | 257/351 |
| 2012/0068267 A1* | 3/2012 | Bedell | | H01L 21/84 257/350 |
| 2012/0098067 A1* | 4/2012 | Yin | | H01L 21/76254 257/351 |
| 2012/0276695 A1* | 11/2012 | Cheng et al. | | 438/154 |
| 2013/0161694 A1* | 6/2013 | Adam et al. | | 257/192 |
| 2013/0264653 A1* | 10/2013 | Cai et al. | | 257/369 |
| 2013/0307021 A1* | 11/2013 | Ching | | H01L 21/823807 257/190 |
| 2014/0011328 A1* | 1/2014 | Bedell et al. | | 438/154 |
| 2014/0021538 A1* | 1/2014 | Bangsaruntip | | H01L 29/66795 257/331 |
| 2014/0027860 A1* | 1/2014 | Glass | | H01L 21/823807 257/401 |
| 2014/0106528 A1* | 4/2014 | Quyang et al. | | 438/275 |
| 2014/0145248 A1* | 5/2014 | Cheng et al. | | 257/288 |
| 2014/0175554 A1* | 6/2014 | Loubet et al. | | 257/368 |
| 2014/0197456 A1* | 7/2014 | Wang | | H01L 29/785 257/192 |

* cited by examiner

*Primary Examiner* — Jarrett Stark
*Assistant Examiner* — Bitew Dinke
(74) *Attorney, Agent, or Firm* — Young & Thompson (57) ABSTRACT

A semiconductor device and method making it comprises pFETs with an SiGe channel and nFETs with an Si channel, formed on an SOI substrate. Improved uniformity of fin height and width is attained by forming the fins additively by depositing an SiGe layer on the SOI substrate and forming first fins from the superposed SiGe layer and underlying thin Si film of the SOI substrate. Second fins of Si can then be formed by replacing the upper SiGe portions of selected first fins with Si.

8 Claims, 8 Drawing Sheets

SEMICONDUCTOR DEVICE HAVING FINFET STRUCTURES AND METHOD OF MAKING SAME

BACKGROUND OF THE INVENTION

1. Field of the Invention

The invention relates to semiconductor devices and methods of making the same, and more particularly relates to such devices and methods in which FinFET structures are formed on a semiconductor substrate.

2. Description of Related Art

As the gate length of transistors continues to decrease with successive generations of semiconductor devices, new transistor configurations have been needed to counteract the diminished response that would otherwise occur with shrinking gate lengths. One such design configuration is referred to variously as a FinFET or tri-gate transistor, in which the source, drain and channel region of each transistor is elevated relative to a semiconductor substrate. The elevated portion has the shape of a ridge or fin, and may be formed integrally with the underlying substrate or may be formed on an insulating layer in the case of SOI type devices. The gate wraps around the three projecting sides of the fin, and so the available channel area is increased by the gate contacting not only the top part of the fin but also its side walls.

It is also known to provide different materials for the channel region of nFET transistors relative to pFET transistors. For example, silicon-germanium (SiGe) as a channel material enhances performance of pFET transistors relative to silicon, but the same is not the case for nFET transistors. Therefore, FinFETS have been proposed in which the channel of the pFET transistors is formed from SiGe, whereas the channel of the nFET transistors is made of silicon.

U.S. Pat. No. 7,198,990 discloses forming FinFETS on a silicon-on-insulator (SOI) substrate by etching the upper layer of silicon to make Si fins, masking the Si fins of the nFET transistors, and depositing a layer of SiGe on the fins of the pFET transistors. However, with this technique, the width of the fins of each channel type is difficult to control relative to the other channel type, and may vary significantly.

U.S. Pat. No. 7,842,559 discloses forming FinFETS by forming a trench for silicon channels to expose an underlying silicon substrate, and after forming an Si fin in that trench, forming a further trench to expose a SiGe film that overlies the silicon substrate, and then forming a SiGe fin in that further trench. However, with this technique, impurity doping is needed for the fin regions intersecting the SiGe layer, to prevent punch-through leakage current.

SUMMARY OF THE INVENTION

Thus, in one aspect, the present invention relates to a method of making a semiconductor device, comprising providing a silicon-on-insulator substrate having a first insulating layer disposed between a first silicon layer and an underlying silicon substrate. A layer of SiGe is deposited on the first silicon layer. The SiGe and first silicon layers are selectively etched to form first fins having a stacked SiGe/Si structure comprising upper SiGe portions and lower Si portions. A second insulating layer is formed so as to cover exposed regions of the first insulating layer and surround the first fins while exposing top surfaces of the first fins. Upper SiGe portions of only selected first ones of the first fins are then removed, so as to expose the lower Si portions thereof. Next, a second silicon layer is formed over the exposed lower Si portions so as to form second fins having an Si structure.

In preferred embodiments of the method according to the present invention, the first fins are heated so as to cause down-diffusion of Ge from the upper SiGe portions into the lower Si portions.

In preferred embodiments of the method according to the present invention, the first silicon layer has a thickness in a range from 3-20 nm, preferably 4-15 nm, and more preferably 5-8 nm.

In preferred embodiments of the method according to the present invention, the layer of SiGe has a thickness greater than a thickness of the first silicon layer.

In preferred embodiments of the method according to the present invention, a mask layer is formed over selected second ones of the first fins prior to removing the upper SiGe portions from the selected first ones of the first fins.

In preferred embodiments of the method according to the present invention, a pFET transistor is formed comprising one or more of the first fins, and an nFET transistor is formed comprising one or more of the second fins.

In preferred embodiments of the method according to the present invention, the second insulating layer is removed after forming the second fins, a gate insulating layer and a gate electrode are formed over the first and second fins, a part of the gate insulating layer and the gate electrode are removed so as to form a first gate insulating layer and a second gate electrode over the first fins and to form a second gate insulating layer and a second gate electrode over the second fins.

In another aspect, the present invention relates to a semiconductor device, comprising a semiconductor substrate, an insulating layer formed on the semiconductor substrate, and pFET and nFET transistors formed on the insulating layer. The pFET transistor has a three-dimensional channel region comprising a first semiconductor material, and the nFET transistor has a three-dimensional channel region comprising a second semiconductor material. The three-dimensional channel region of each of the pFET transistor and nFET transistor overlies a respective region of the insulating layer that is elevated relative to surrounding regions of the insulating layer.

In preferred embodiments of the semiconductor device according to the present invention, the first semiconductor material is silicon-germanium, and the second semiconductor material is silicon.

In preferred embodiments of the semiconductor device according to the present invention, the channel region of the pFET transistor comprises a layer of silicon underlying the silicon germanium and overlying the insulating layer.

In preferred embodiments of the semiconductor device according to the present invention, the layer of silicon has a thickness of less than 10 nm.

In preferred embodiments of the semiconductor device according to the present invention, the three-dimensional channel region of the pFET transistor has a width and height that is equal to a width and height of the three-dimensional channel region of the nFET transistor.

In preferred embodiments of the semiconductor device according to the present invention, the second semiconductor material is fully depleted silicon and the three-dimensional channel region of the nFET is embodied in a fin that projects upwardly from the insulating layer by a distance greater than 20 nm.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION

In FIGS. 1-5, a first embodiment of the present invention is a CMOS type semiconductor device that includes pFETs and nFETs, with an exemplary pFET being designated 40 and an exemplary nFET being designated 50. The device of FIG. 1 has been built on a silicon-on-insulator or SOI substrate, of which, in the finished device, the bulk silicon substrate 10 and the (initially buried) oxide layer 12 remain.

Figure 1:
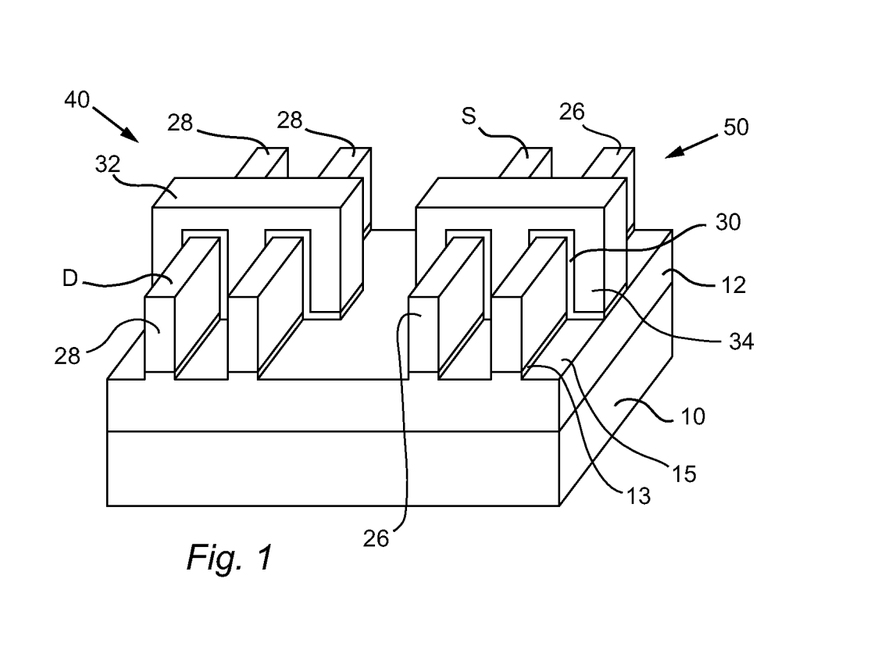
FIG. 1 is a perspective view of a semiconductor device according to a first embodiment of the methods and devices according to the present invention.
Figure 2:
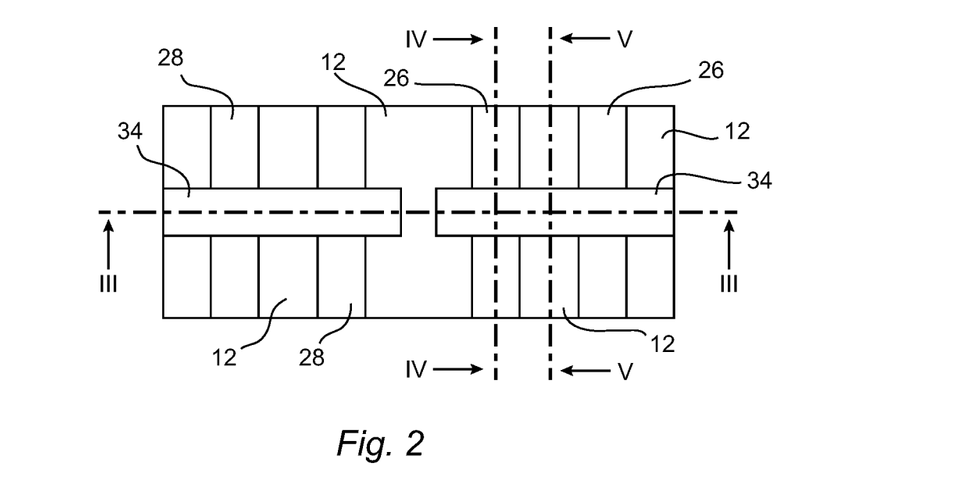
FIG. 2 is a plan view of the device shown in FIG. 1.
Figure 3:
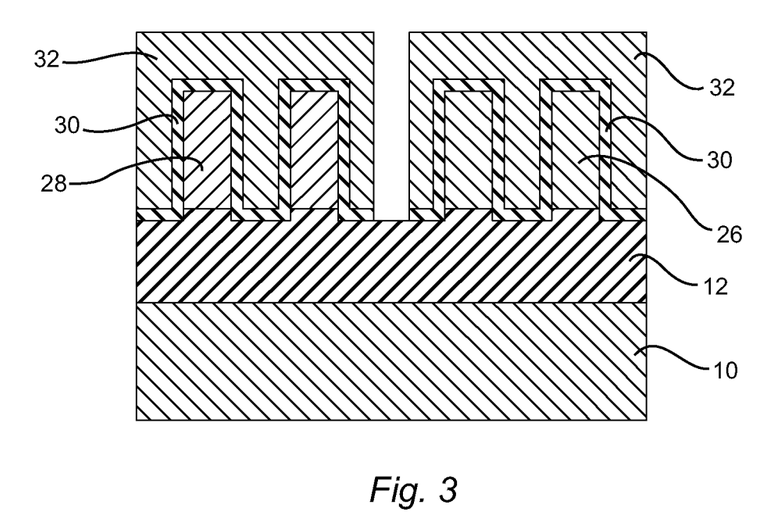
FIG. 3 is a cross-sectional view along the line III-III of FIG. 2.
Figure 4:
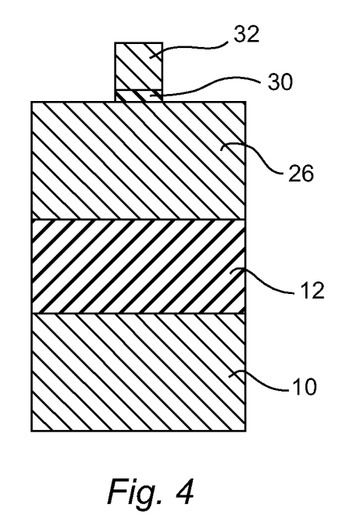
FIG. 4 is a cross-sectional view along the line IV-IV of FIG. 2.
Figure 5:
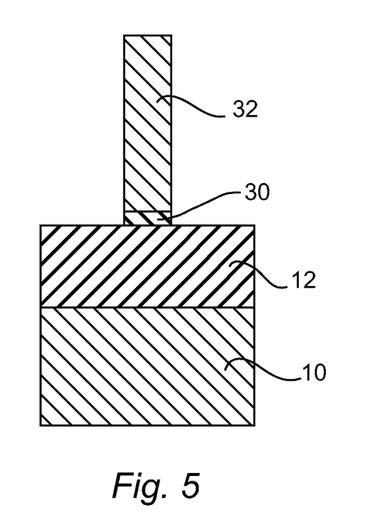
FIG. 5 is a cross-sectional view along the line V-V of FIG. 2.

As can be seen in FIG. 1, the pFET 40 comprises a pair of fins 28, whereas the nFET 50 comprises a pair of fins 26. Fins 26, 28 project upwardly from the insulating layer 12, and overlie regions 13 of insulating layer 12 that are elevated in relation to surrounding regions 15 of the insulating layer 12. Each of pFET 40 and nFET 50 comprises a gate 32, for example made of polysilicon, which surrounds each of a respective pair of fins 26, 28 on three sides. A gate oxide layer 30 is formed between the gates 32 and their respective fins 26 or 28.

This configuration is also sometimes referred to as a "tri-gate" transistor, because of the contact between the gate 32 and the channel regions of fins 26, 28 on three sides of the fins. In alternative embodiments, a substantially thicker dielectric layer is formed between the gates 32 and the top surfaces of fins 26, 28, so that the channel region is confined to the opposite sides of the fins 26, 28. In still other alternative embodiments, the gate 32 also extends beneath the fins 26, 28, between the fins and the insulating layer 12, to form a gate-all-around (GAA) transistor structure.

Fins 26 and 28 are formed from respectively different semiconductor materials, and in this embodiment fins 26 are silicon whereas fins 28 are SiGe. The channel regions of fins 26, 28, i.e., the portions of the fins covered by gates 32, are preferably fully depleted. On the other hand, the exposed regions of fins 26, 28 are suitably doped so as to create source regions S and drain regions D for the transistors 40, 50.

Figure 6:
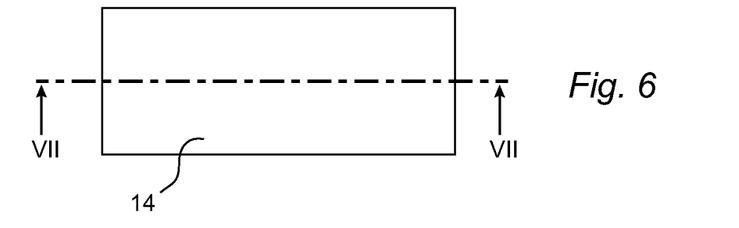
FIG. 6 is a plan view of an SOI substrate that may be used to produce a semiconductor device as shown in FIG. 1.

The semiconductor device of FIGS. 1-5 may be manufactured as is hereinafter described beginning with FIGS. 6 and 7. In FIG. 6, an SOI substrate is illustrated, which comprises an underlying bulk silicon substrate 10, an intermediate buried oxide layer (or "BOX") 12, and a thin upper silicon layer 14. The upper silicon layer 14 is preferably fully depleted, and as such will have a thickness not greater than about 20 nm, and preferably less than 10 nm, for example about 3-8 nm.

Figure 7:
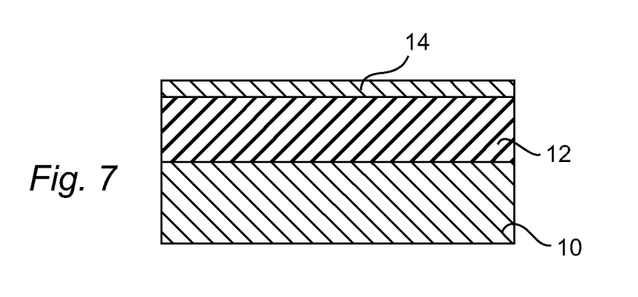
FIG. 7 is a cross-sectional view along the line VII-VII of FIG. 6.

The SOI substrate shown in FIGS. 6 and 7 may for example be a silicon wafer, for example of 300 mm or 450 mm diameter. Alternatively, the SOI substrate shown in FIGS. 6 and 7 may be an SOI region on a hybrid wafer or other substrate, which also includes bulk silicon regions for formation of devices for which an SOI substrate is not desired.

Figure 8:
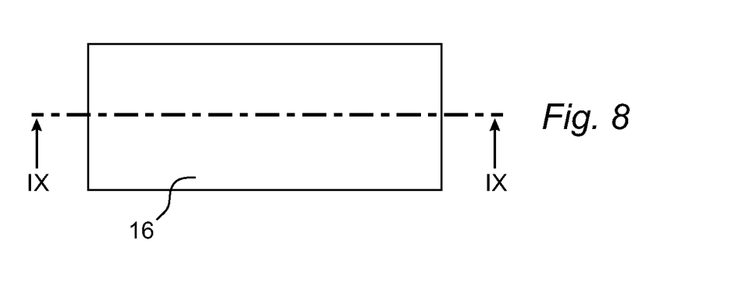
FIG. 8 is a plan view of an intermediate structure in a manufacturing process of making the device of FIG. 1.
Figure 9:
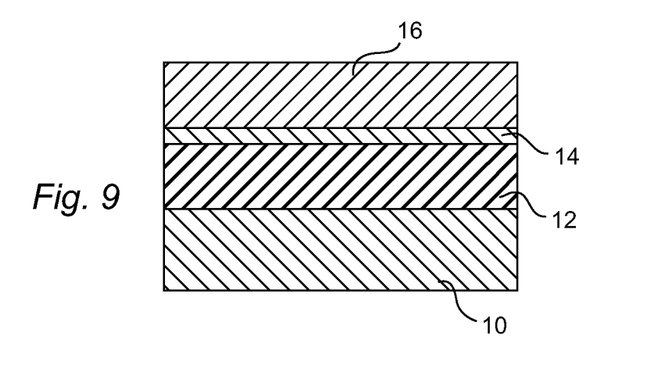
FIG. 9 is a cross-sectional view along the line IX-IX of FIG. 8.

Next, as shown in FIGS. 8 and 9, a layer 16 of a second semiconductor material is grown epitaxially on the silicon layer 14. Layer 16 in this embodiment is silicon-germanium (SiGe), for example a combination of about 25% Ge and 75% Si, although various other proportions could be used. Layer 16 is substantially thicker than layer 14, and is preferably at least twice as thick. For example, layer 16 may have a thickness in a range from 10-40 nm, preferably 15-25 nm.

Figure 10:
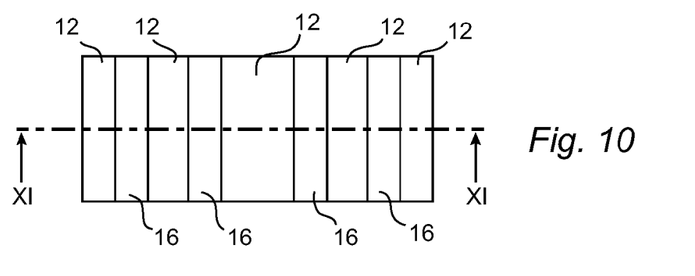
FIG. 10 is a plan view of the intermediate structure in a succeeding state of a manufacturing process of making the device of FIG. 1.
Figure 11:
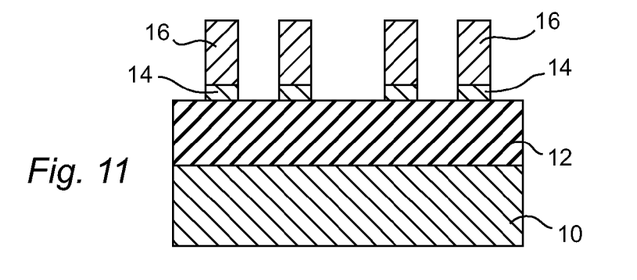
FIG. 11 is a cross-sectional view along the line XI-XI of FIG. 10.

Turning now to FIGS. 10 and 11, the layers 16 and 14 are then patterned, for example by lithography and dry etching, to form a series of fins having a stacked composition made up of the relatively thicker upper SiGe portion 16 and the relatively thinner underlying Si portion 14. Depending upon the desired device dimensions and the lithographic equipment utilized, fins 16/14 may if desired be formed by sublithographic techniques, for example, sidewall image transfer (SIT).

In etching the layers 16, 14 to form the fins illustrated in FIGS. 10 and 11, the buried oxide layer 12 of the SOI substrate acts as an etch stop, so that it is unnecessary to perform a timed etch as when forming fins in a bulk silicon substrate. However, in conventional techniques for forming finFETs on SOI substrates, the height of the fins is dictated by the thickness of the thin upper silicon layer of the SOI substrate.

By contrast, in the method and device according to preferred embodiments of the present invention, the height of the fins can be determined at will be appropriate selection of the thickness of not only the thin silicon layer 14 but also the thickness to which the SiGe layer 16 is formed. This aspect of the present invention helps to promote greater device uniformity, improved performance, and improved control over short-channel effect. On the other hand, in conventional techniques where the fin thickness is dictated by the thickness of the upper silicon layer of an SOI substrate, variation in the thickness of the thin upper silicon layer will be translated into variations in the height of the fins.

Figure 12:
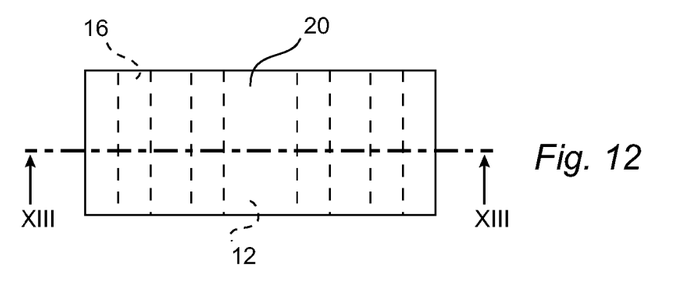
FIG. 12 is a plan view of the intermediate structure in a succeeding state of a manufacturing process of making the device of FIG. 1.
Figure 13:
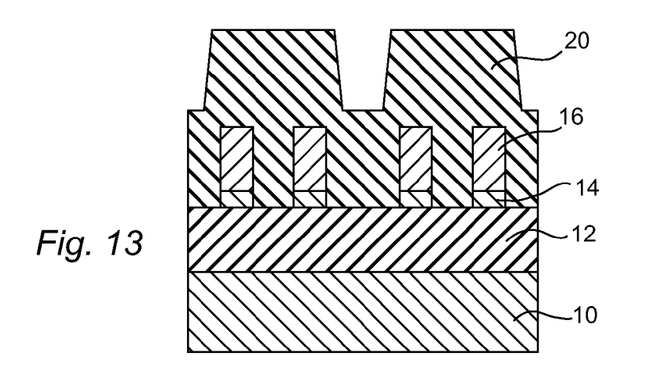
FIG. 13 is a cross-sectional view along the line XIII-XIII of FIG. 12.

Next, as shown in FIGS. 12 and 13, a further insulating layer 20 is deposited on the device, to a thickness sufficient to entirely cover the fins 16/14 as well as the surrounding exposed regions of the insulating layer 12. Insulating layer 20 may be for example silicon dioxide ($SiO_2$).

Figure 14:
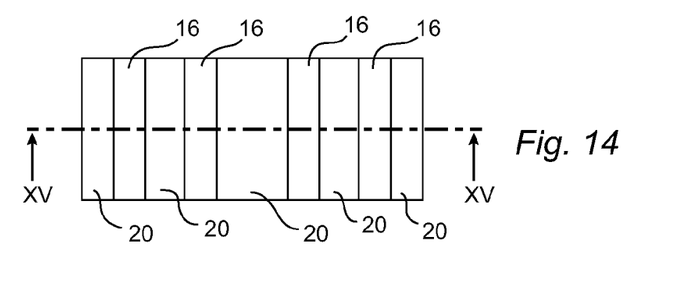
FIG. 14 is a plan view of the intermediate structure in a succeeding state of a manufacturing process of making the device of FIG. 1.
Figure 15:
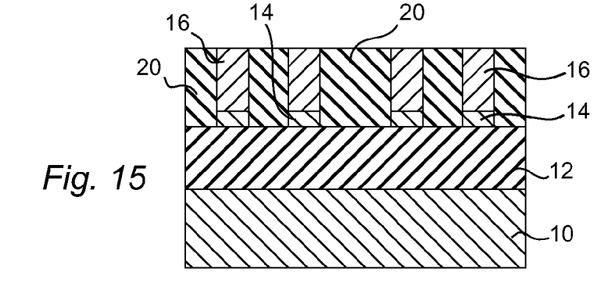
FIG. 15 is a cross-sectional view along the line XV-XV of FIG. 14.

As shown in FIGS. 14 and 15, the insulating layer 20 is then etched back and planarized, for example by CMP, so as to expose the top surfaces of the SiGe fins 16.

Figure 16:
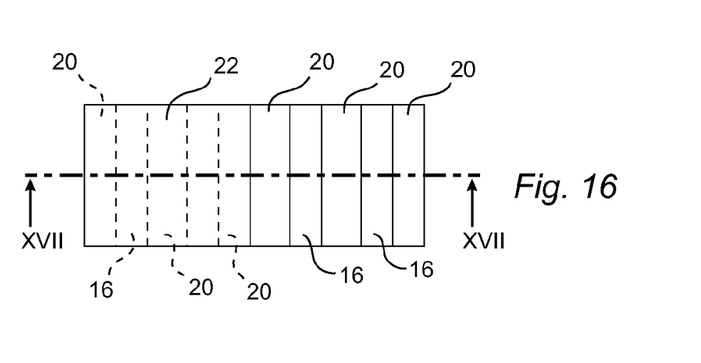
FIG. 16 is a plan view of the intermediate structure in a succeeding state of a manufacturing process of making the device of FIG. 1.
Figure 17:
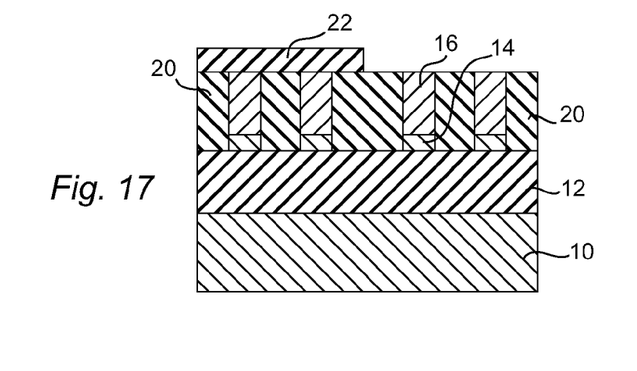
FIG. 17 is a cross-sectional view along the line XVII-XVII of FIG. 16.

Next, as shown in FIGS. 16 and 17, a hard mask 22, made for example of SiN, is formed and patterned so as to cover some but not others of the fin stacks 16/14. In particular, in this embodiment, mask 22 covers those fin stacks 16/14 that will be included in pFET transistors, whereas the fin stacks 16/14 that will be included in nFET transistors are left uncovered.

Figure 18:
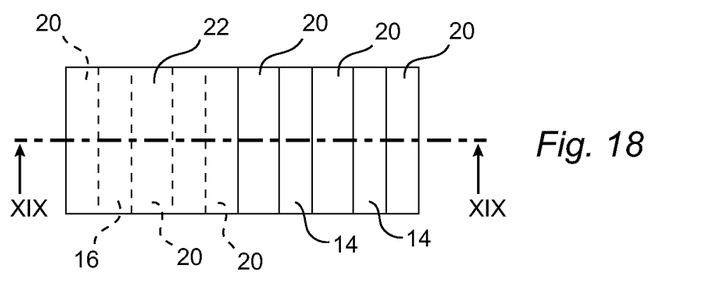
FIG. 18 is a plan view of the intermediate structure in a succeeding state of a manufacturing process of making the device of FIG. 1.
Figure 19:
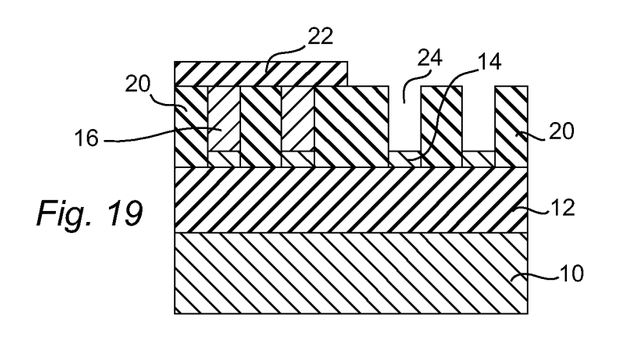
FIG. 19 is a cross-sectional view along the line XIX-XIX of FIG. 18.

Referring now to FIGS. 18 and 19, the exposed fin portions 16 are then removed, to leave trenches 24 between adjacent regions of insulating layer 20. Notably, however, the silicon portions 14 at the bottoms of these trenches 24 remain, and are not removed with the overlying SiGe portions 16. This is accomplished by etching the exposed SiGe fin portions 16 under conditions that are selective to SiGe and selective against silicon. For example, suitable selective etching conditions include gas etching with HCl at a temperature above 500° C.

Figure 20:
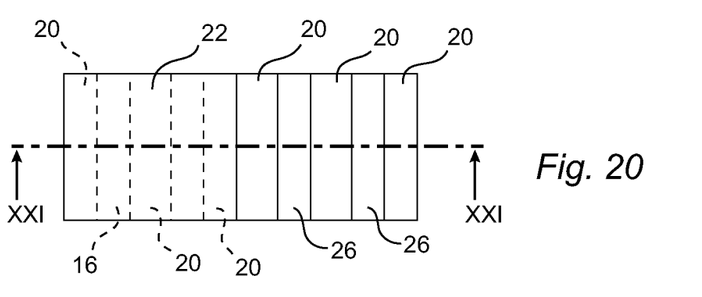
FIG. 20 is a plan view of the intermediate structure in a succeeding state of a manufacturing process of making the device of FIG. 1.
Figure 21:
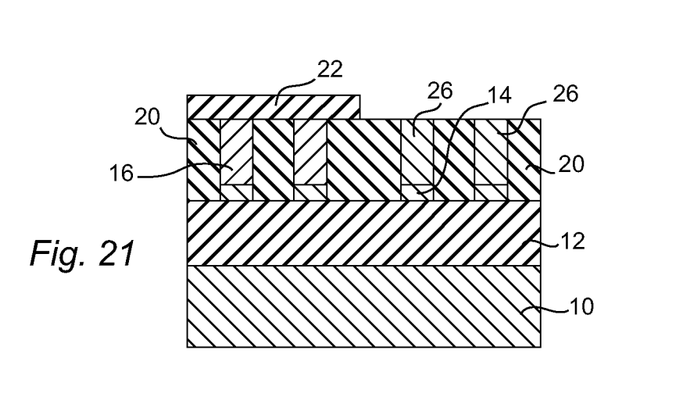
FIG. 21 is a cross-sectional view along the line XXI-XXI of FIG. 20.

Next, as shown in FIGS. 20 and 21, silicon is epitaxially grown in the trenches 24, so as to fill those trenches with upper silicon fin portions 26. During this step, the exposed silicon portions 14 that remained in the bottom of trenches 24 serve as a template for the epitaxial growth of the upper Si fin portions 26. If the Si portions 14 at the bottom of trenches 24 had been completely eliminated during the previous fin etch step, then the new Si fin portions 26 could not be grown epitaxially in the trenches 24. However, thanks to the SiGe/Si etching selectivity used during the removal of the sacrificial fin portions 16, the remaining thickness of the Si portions 14 is well controlled and is mainly determined by the thickness of the layer 14 in the initial SOI substrate.

This epitaxial Si growth can be stopped when the regions 26 are coplanar with the adjacent dielectric regions 20 by a timed deposition. Alternatively, the Si regions 26 can be overgrown beyond the adjacent dielectric regions 20 and then planarized, for example by CMP.

Figure 22:
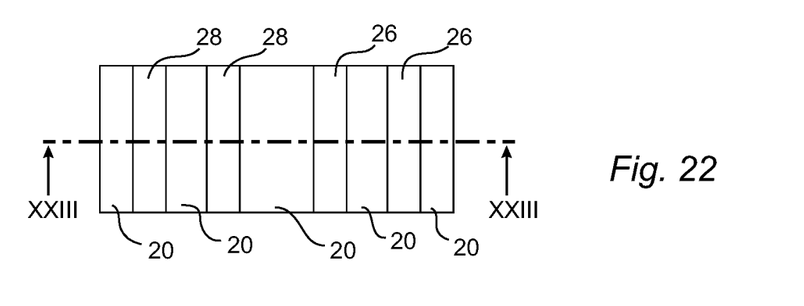
FIG. 22 is a plan view of the intermediate structure in a succeeding state of a manufacturing process of making the device of FIG. 1.
Figure 23:
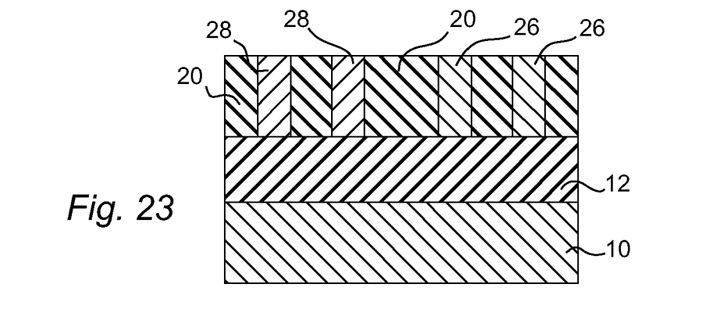
FIG. 23 is a cross-sectional view along the line XXIII-XXIII of FIG. 22.

In FIGS. 22 and 23 the hard mask 22 has been removed. The device as illustrated in those figures has also undergone an optional thermal treatment, to cause down-diffusion of Ge from the previously-masked SiGe fin portions 16 into the underlying Si portions 14, thereby to form a more homogeneous SiGe fin 28. However, it is also possible to omit this thermal treatment, and to keep the fins in the pFET transistors in the form of the SiGe/Si stacks 16/14.

Figure 24:
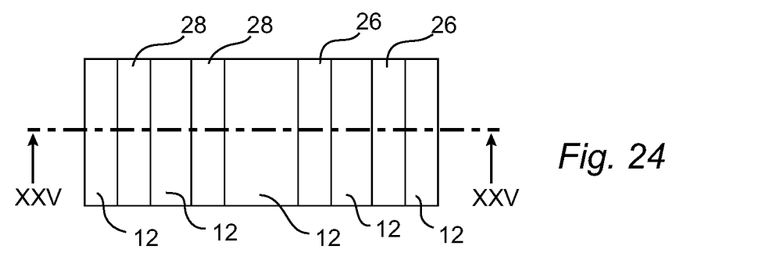
FIG. 24 is a plan view of the intermediate structure in a succeeding state of a manufacturing process of making the device of FIG. 1.
Figure 25:
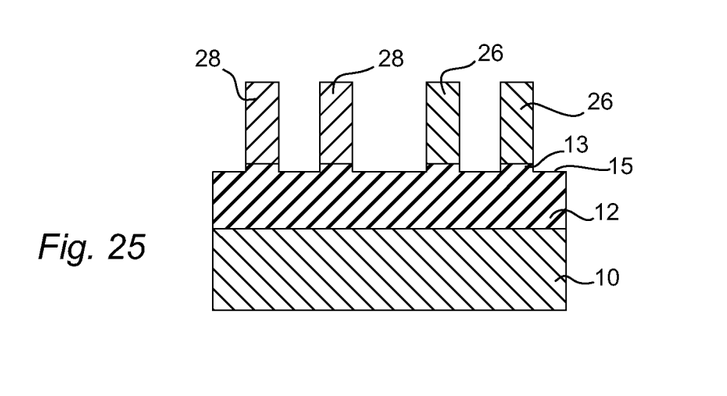
FIG. 25 is a cross-sectional view along the line XXV-XXV of FIG. 24.
Figure 26:
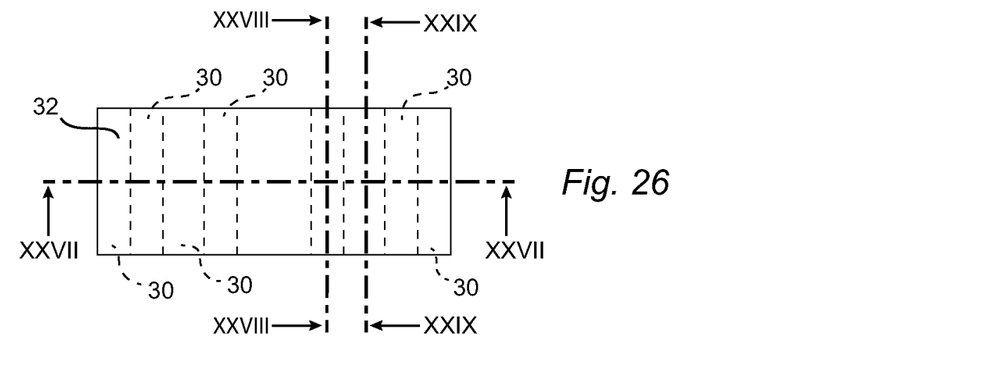
FIG. 26 is a plan view of the intermediate structure in a succeeding state of a manufacturing process of making the device of FIG. 1.
Figure 27:
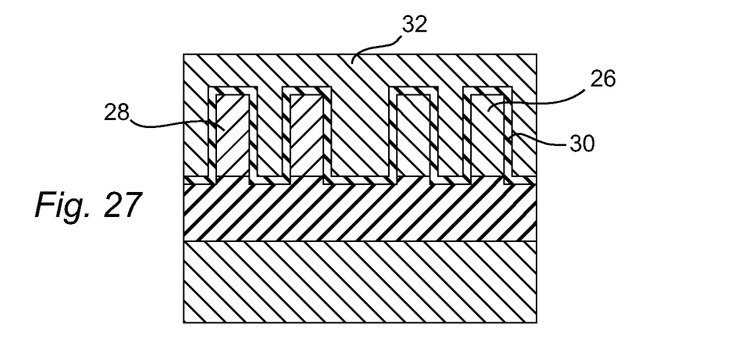
FIG. 27 is a cross-sectional view along the line XXVII-XXVII of FIG. 26.
Figure 28:
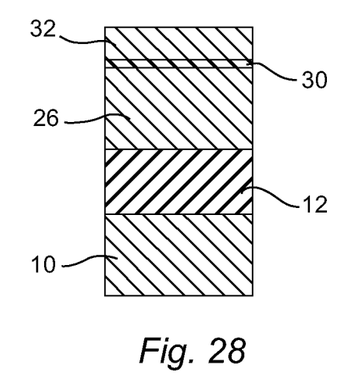
FIG. 28 is a cross-sectional view along the line XXVIII-XXVIII of FIG. 26.
Figure 29:
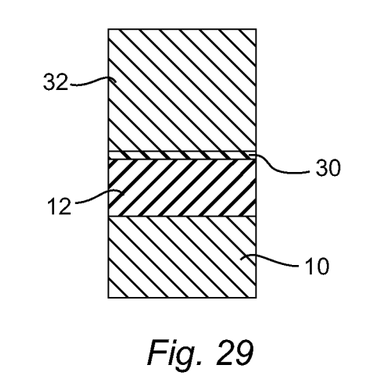
FIG. 29 is a cross-sectional view along the line XXIX-XXIX of FIG. 26.

Next, as shown in FIGS. 24 and 25, the insulating layer 20 between the fins 26, 28 is removed by a suitable etching technique. This step may also partly etch the buried insulator layer 12 of the SOI substrate, whereby the regions covered by the fins 26, 28 become the raised areas 13, and the regions attacked by the etchant become the recessed regions 15, as discussed above.

FIGS. 26-29 show the preliminary steps for formation of the gates 32, first by deposition of a layer of gate dielectric 30, and then by deposition of the material that will constitute the gates 32. That material may for example by polysilicon. Gate 32 may be formed from a single material or may be formed from layers of different materials. Furthermore, the materials for gates 32 may if desired differ as between the pFETs and nFETs, or may differ among transistors of either type, for example by the selection of appropriate materials and combinations of materials to create respectively different work functions for different gates, and hence different threshold voltages for the associated transistors.

Lastly, the gate dielectric layer 30 and the gate layer 32 are patterned so as to form plural gates 32 as illustrated in FIGS. 1-5. The source and drain regions S, D may then be defined. For example, a p-type source/drain is formed on the fins 28 of the pFET transistors, whereas an n-type source/drain is formed on the fins 26 of the nFET transistors. These source and drain regions may be formed for example by ion implantation, doped epitaxy, or any other suitable technique.

It will be appreciated that the methods and devices as described above permit forming fins for both pFET and nFET transistors with precisely controlled dimensions, as a result of the replacement fin (fin formation/fin recess/fin re-growth) process described herein. This results in performance gains for both the nFET and pFET transistors so formed, as well as maintaining good control of the short-channel effect. Moreover, leakage current paths can be eliminated by using SOI fins, without the need for a punch-through stopper as in the prior art.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A method of making a semiconductor device, comprising:
   providing a silicon-on-insulator substrate having a first insulating layer disposed between a first silicon layer and an underlying silicon substrate;
   depositing a layer of SiGe on the first silicon layer;
   selectively etching the SiGe and first silicon layers to form first fins having a stacked SiGe/Si structure comprising SiGe portions on top of Si portions, each stacked SiGe/Si structure separated from each other by a gap;
   forming a second insulating layer that covers exposed regions of said first insulating layer and fills the gaps between each of said first fins and surrounding said first fins;
   etching and planarizing the second insulating layer so that top surfaces of the SiGe portions of said first fins are exposed;

for only selected first ones of said first fins, removing the SiGe portions so that upper surfaces of corresponding Si portions directly beneath the removed SiGe portions of the selected first ones of said first fins are exposed; and forming a second silicon layer over the exposed upper surfaces of the Si portions of the selected first ones of said first fins so as to form second fins having an Si structure.

2. The method according to claim 1, further comprising:
heating said first fins so as to cause down-diffusion of Ge from said SiGe portions into said lower Si portions.

3. The method according to claim 1, wherein said first silicon layer has a thickness in a range from 3-20 nm, preferably 4-15 nm, and more preferably 5-8 nm.

4. The method according to claim 1, wherein said layer of SiGe has a thickness greater than a thickness of said first silicon layer.

5. The method according to claim 1, further comprising:
forming a mask layer over selected second ones of said first fins prior to removing the SiGe portions from said selected first ones of said first fins.

6. The method according to claim 1, further comprising forming a pFET transistor comprising one or more of said first fins, and an nFET transistor comprising one or more of said second fins.

7. The method according to claim 1, further comprising:
removing the second insulating layer after forming said second fins;
forming a gate insulating layer and a gate electrode over said first and second fins; and
removing a part of the gate insulating layer and the gate electrode so as to form a first gate insulating layer and a second gate electrode over the first fins and to form a second gate insulating layer and a second gate electrode over the second fins.

8. The method according to claim 1, further comprising:
prior to said removing step, forming a mask over the second insulating layer of non-selected ones of said first fins thereby to cover the non-selected ones of said first fins, the selected first ones of said first fins remaining exposed.

* * * * *